United States Patent
Miyamoto

(10) Patent No.: US 6,363,003 B1
(45) Date of Patent: Mar. 26, 2002

(54) FERROELECTRIC MEMORY DEVICE

(75) Inventor: Yasuo Miyamoto, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/644,281

(22) Filed: Aug. 22, 2000

(30) Foreign Application Priority Data

Nov. 8, 1999 (JP) .......................................... 11-317492

(51) Int. Cl.[7] .............................................. G11C 11/22
(52) U.S. Cl. ........................... 365/145; 365/63; 365/65; 365/149; 365/185.11; 365/230.03; 365/230.06
(58) Field of Search .................................. 365/145, 149, 365/63, 65, 185.11, 230.01, 230.03, 230.06

(56) References Cited

U.S. PATENT DOCUMENTS

| | | | | |
|---|---|---|---|---|
| 5,969,982 A | * | 10/1999 | Koo ............................ | 365/145 |
| 5,991,188 A | * | 11/1999 | Chung et al. ................ | 365/145 |
| 6,038,160 A | * | 3/2000 | Nakane et al. ............... | 365/145 |
| 6,058,040 A | * | 5/2000 | Tada ........................... | 365/145 |
| 6,088,257 A | * | 7/2000 | Jeon et al. ................... | 365/145 |
| 6,147,895 A | * | 11/2000 | Kamp ......................... | 365/145 |
| 6,198,653 B1 | * | 3/2001 | Tanaka ........................ | 365/145 |
| 6,201,727 B1 | * | 3/2001 | Jeon ............................ | 365/145 |
| 6,256,220 B1 | * | 7/2001 | Kamp ......................... | 365/145 |
| 6,262,910 B1 | * | 7/2001 | Tanaka et al. ............... | 365/145 |

FOREIGN PATENT DOCUMENTS

| | | | |
|---|---|---|---|
| JP | 10-162589 | | 6/1998 |
| JP | 4102000058 A | * | 7/1998 |
| JP | 02000349248 | * | 12/2000 |

* cited by examiner

*Primary Examiner*—Viet Q. Nguyen
(74) *Attorney, Agent, or Firm*—Morrison & Foerster, LLP

(57) ABSTRACT

A ferroelectric memory device includes: a matrix of memory cells each including a semiconductor transistor and a ferroelectric capacitor; word lines and bit lines provided so as to intersect each other; and plate lines provided substantially in parallel to the word lines, at least two plate lines corresponding to each of the word lines. A drain of the semiconductor transistor is coupled to a first electrode of the ferroelectric capacitor; a source of the semiconductor transistor is coupled to a corresponding bit line; a gate of the semiconductor transistor is coupled to a corresponding word line; and a second electrode of the ferroelectric capacitor is coupled to a corresponding plate line. The device further includes: a selection/driving circuit being coupled to the word lines and the plate lines and receiving a ROW address, the ROW address divided into a first portion and a second portion. The first portion of the ROM address is used to select and activate at least one of the word lines which defines a broader area than is designated by the ROW address. The second portion of the ROW address is used to select and activate at least one of the plate lines, thereby selecting at least one of the memory cells whose corresponding word line and whose corresponding plate line are both activated.

9 Claims, 9 Drawing Sheets

FERROELECTRIC MEMORY DEVICE

BACKGROUND OF THE INVENTION

1. Field of the Invention

The present invention relates to a semiconductor memory device incorporating a ferroelectric material (hereinafter referred to as a "ferroelectric memory device"). More specifically, the present invention relates to a ferroelectric memory device including memory elements (memory cells) each composed of at least one semiconductor transistor and at least one ferroelectric capacitor, such that at least one of the memory cells is selected based on activation of the semiconductor transistor associated therewith, and information is stored in the selected memory cell based on a polarization direction of the associated ferroelectric capacitor.

2. Description of the Related Art

FIGS. 9 and 10 show the respective memory cell structures of commonly-used ferroelectric memory devices 900 and 1000. The conventional ferroelectric memory device 900 shown in FIG. 9 is of a type referred to as "2-transistor-2-capacitor" (hereinafter "2T2C"), in which each memory cell is composed essentially of two semiconductor transistors 1 and two ferroelectric capacitors 2. One piece of data is stored in one memory cell. The conventional ferroelectric memory device 1000 shown in FIG. 10 is of a type referred to as "1-transistor-1-capacitor" (hereinafter "1T1C"), in which each memory cell is composed essentially of one semiconductor transistor 1 and one ferroelectric capacitor 2. One piece of data is stored in one memory cell.

In the conventional ferroelectric memory device 900 shown in FIG. 9, word lines (WL0, WL1) and bit lines (BIT0, BIT0#, BIT1, BIT1#, BIT2, BIT2#, BIT3, BIT3#, etc.) intersect each other (illustrated as perpendicularly intersecting each other in FIG. 9), and the word lines and plate lines (PL0, PL1) are disposed in parallel to each other. A source of each semiconductor transistor 1 is coupled to one of the bit lines; a drain of each semiconductor transistor 1 is coupled to a first electrode of the associated ferroelectric capacitor 2; a gate of each semiconductor transistor 1 is coupled to one of the word lines; and a second electrode of the associated ferroelectric capacitor 2 is coupled to one of the plate lines. Furthermore, a pair of bit lines (BIT0 and BIT0#; BIT1 and BIT1#; BIT2 and BIT2#; BIT3 and BIT3#, etc.) are coupled in common to a sense amplifier 3.

In the ferroelectric memory device 900 of FIG. 9, each semiconductor transistor 1 and its associated ferroelectric capacitor 2 are provided in the vicinity of an intersection between a bit line and a word line. On the other hand, in the ferroelectric memory device 1000 of FIG. 10, each semiconductor transistor 1 and its associated ferroelectric capacitor 2 are provided in the vicinity of an intersection between every other bit line and a word line (e.g., an intersection between the bit lines BIT0 and BIT0# and the word line WL0).

In the ferroelectric memory devices 900 and 1000, a memory cell may be selected in the following manner. First, the word line WL0 may be selected so as to go high ("H"), and then a pulse voltage may be applied to the plate line PL0. (Similarly, the word line WL1 may be selected so as to go high ("H"), and then a pulse voltage may be applied to the plate line PP1). The applied pulse voltage, if applied in the same direction as the polarization direction of each ferroelectric capacitor 2, destroys the polarization of that ferroelectric capacitor 2 so that its polarization direction is inverted. As a result, those memory cells in which the polarization of the ferroelectric capacitors 2 is inverted output a different charge amount on the associated bit line from the charge amount output by those memory cells in which the polarization of the ferroelectric capacitors 2 is not inverted. Specifically, those memory cells in which the polarization of the ferroelectric capacitors 2 is inverted output a higher charge amount from their respective ferroelectric capacitors 2 than those memory cells in which the polarization of the ferroelectric capacitors 2 is not inverted. These differential charge amounts are amplified by the sense amplifiers 3, resulting in "H" or "L" data being output on the corresponding bit lines.

However, in accordance with the structures of FIGS. 9 and 10, a large number of ferroelectric capacitors 2 are directly coupled to each plate line. Since the ferroelectric capacitors 2 have a relatively large capacitance, delays on the plate line become more problematic as more ferroelectric capacitors 2 are coupled to the plate line. In general, a ferroelectric capacitor has a capacitance which is about 10 times or more of the gate capacitance of a semiconductor transistor. Therefore, if the number of semiconductor transistors coupled to a word line is the same as the number of ferroelectric capacitors coupled to a plate line, then the plate line has a capacitance which is about 10 times or more of that of the word line.

In order to solve this problem, Japanese Laid-Open Publication No. 10-162589 proposes a "2T2C" type ferroelectric memory device 1100 structure as shown in FIG. 11. The ferroelectric memory device 1100 includes a plurality of plate lines corresponding to each word line (so that plate lines PL0A and PL0B correspond to a word line WL0; plate lines PL1A and PL1B correspond to a word line WL1). For example, the plate lines PL0A and PL0B correspond to the word line WL0. The plate line PL0A corresponds to bit lines BIT0, BIT0#, BIT1 and BIT1#. The plate line PL0B corresponds to bit lines BIT2, BIT2#, BIT3 and BIT3#. Otherwise, the ferroelectric memory device 1100 has the same structure as that of the ferroelectric memory device 900 of FIG. 9. Since the structure of the ferroelectric memory device 1100 reduces the number of ferroelectric capacitors coupled to the plate lines to a half of what it would be otherwise, the operational speed of the plate lines is improved.

Although not disclosed in the 10-162589 application, an application of this technique to a "1T1C" type configuration should be as shown in FIG. 12. Specifically, plate lines PL0A and PL0B are provided so as to correspond to a word line WL0, and plate lines PL1A and PL1B are provided so as to correspond to a word line WL1. The plate lines PL0A and PL1A correspond to bit lines BIT0, BIT0#, BIT1 and BIT1#. The plate lines PL0B and PL1B correspond to bit lines BIT2, BIT2#, BIT3 and BIT3#. Otherwise, the ferroelectric memory device 1200 has the same structure as that of the ferroelectric memory device 1000 of FIG. 10.

However, in accordance with the ferroelectric memory device 1100 (or 1200) shown in FIG. 11 (or 12) of the 10-162589 application, a word line is selected based on a ROW address, and a plate line is selected based on a COL address. According to this method, the sense amplifiers cannot operate before it is determined which one of the plate lines is to be activated. Under a DRAM type input (i.e., address multiplex) scheme, this results in an increased access time. Since a period of time must be waited in order for a COL address to be input, this structure cannot provide for an enhanced operational speed, in spite of the reduction of the plate line capacitance (which would otherwise enable some enhancement in the operational speed).

Furthermore, there is also a problem in that adjoining bit lines are simultaneously sensed in all of the ferroelectric memory devices 900, 1000, 1100, and 1200 shown in FIGS. 9, 10, 11 and 12, thereby resulting in a reduced sensing margin (since the sensing of one bit line may always be influenced by, or subjected to the interference of, an adjoining bit line).

SUMMARY OF THE INVENTION

A ferroelectric memory device including: a matrix of memory cells each including a semiconductor transistor and a ferroelectric capacitor; a plurality of word lines and a plurality of bit lines provided so as to intersect each other; and a plurality of plate lines provided substantially in parallel to the word lines, at least two plate lines corresponding to each of the word lines, wherein a drain of the semiconductor transistor is coupled to a first electrode of the ferroelectric capacitor; a source of the semiconductor transistor is coupled to a corresponding one of the plurality of bit lines; a gate of the semiconductor transistor is coupled to a corresponding one of the plurality of word lines; and a second electrode of the ferroelectric capacitor is coupled to a corresponding one of the plurality of plate lines, the ferroelectric memory device further including: a selection/driving circuit being coupled to the plurality of word lines and the plurality of plate lines and receiving a ROW address, the ROW address being divided into a first portion and a second portion, wherein the first portion of the ROW address is used to select and activate at least one of the plurality of word lines, the at least one word line defining a broader area than is designated by the ROW address, and wherein the second portion of the ROW address is used to select and activate at least one of the plurality of plate lines, thereby selecting at least one of the plurality of memory cells whose corresponding word line and whose corresponding plate line are both activated.

In one embodiment of the invention, two or more plate lines are provided so as to correspond to each of the plurality of word lines, and memory cells coupled to adjoining ones of the plurality of bit lines are coupled to different ones of the plurality of plate lines.

In another embodiment of the invention, the ferroelectric memory device further includes a transfer gate for electrically coupling a selected one of the plurality of bit lines to a sense amplifier and a grounding transistor for electrically isolating an unselected one of the plurality of bit lines from a sense amplifier, wherein a signal for controlling the transfer gate fixes the unselected one of the plurality of bit lines at a level which will not destroy data stored in the unselected memory cells.

In still another embodiment of the invention, the ferroelectric memory device further includes sense amplifiers coupled to the plurality of bit lines, wherein a signal for activating at least one of the sense amplifiers that is coupled to the selected one of the plurality of bit lines fixes the unselected one of the plurality of bit lines at a level which will not destroy data stored in the unselected memory cells.

In still another embodiment of the invention, the selection/driving circuit selects two or more of the plurality of memory cells coupled to the same one of the plurality of bit lines by selecting and activating two or more of the plurality of word lines, and wherein the selection/driving circuit further selects at least one memory cell from among the two or more selected memory cells coupled to the same bit line by selecting and activating at least one of the plurality of plate lines.

Alternatively, a ferroelectric memory device according to the present invention includes: a matrix of memory cells each including a semiconductor transistor and a ferroelectric capacitor; a plurality of word lines and a plurality of bit lines provided so as to intersect each other; and a plurality of plate lines provided substantially in parallel to the word lines, at least two plate lines corresponding to each of the word lines, wherein a drain of the semiconductor transistor is coupled to a first electrode of the ferroelectric capacitor; a source of the semiconductor transistor is coupled to a corresponding one of the plurality of bit lines; a gate of the semiconductor transistor is coupled to a corresponding one of the plurality of word lines; and a second electrode of the ferroelectric capacitor is coupled to a corresponding one of the plurality of plate lines, and wherein memory cells coupled to adjoining ones of the plurality of bit lines are coupled to different ones of the plurality of plate lines.

In one embodiment of the invention, the ferroelectric memory device further includes a transfer gate for electrically coupling a selected one of the plurality of bit lines to a sense amplifier and a grounding transistor for electrically isolating an unselected one of the plurality of bit lines from a sense amplifier, wherein a signal for controlling the transfer gate fixes the unselected one of the plurality of bit lines at a level which will not destroy data stored in the unselected memory cells.

In another embodiment of the invention, the memory device further includes sense amplifiers coupled to the plurality of bit lines, wherein a signal for activating at least one of the sense amplifiers that is coupled to the selected one of the plurality of bit lines fixes the unselected one of the plurality of bit lines at a level which will not destroy data stored in the unselected memory cells.

In still another embodiment of the invention, the selection/driving circuit selects two or more of the plurality of memory cells coupled to the same one of the plurality of bit lines by selecting and activating two or more of the plurality of word lines, and wherein the selection/driving circuit further selects at least one memory cell from among the two or more selected memory cells coupled to the same bit line by selecting and activating at least one of the plurality of plate lines.

Thus, the invention described herein makes possible the advantages of (1) providing a ferroelectric memory device which can provide for an enhanced operational speed based on the reduction of the plate line capacitance without employing COL addresses; and (2) providing a ferroelectric memory device which can provide for an improved sensing margin by preventing interference from adjoining bit lines.

These and other advantages of the present invention will become apparent to those skilled in the art upon reading and understanding the following detailed description with reference to the accompanying drawings.

DESCRIPTION OF THE PREFERRED EMBODIMENTS

Hereinafter, the present invention will be described by way of examples, with reference to the accompanying figures.

EXAMPLE 1

Figure 1:
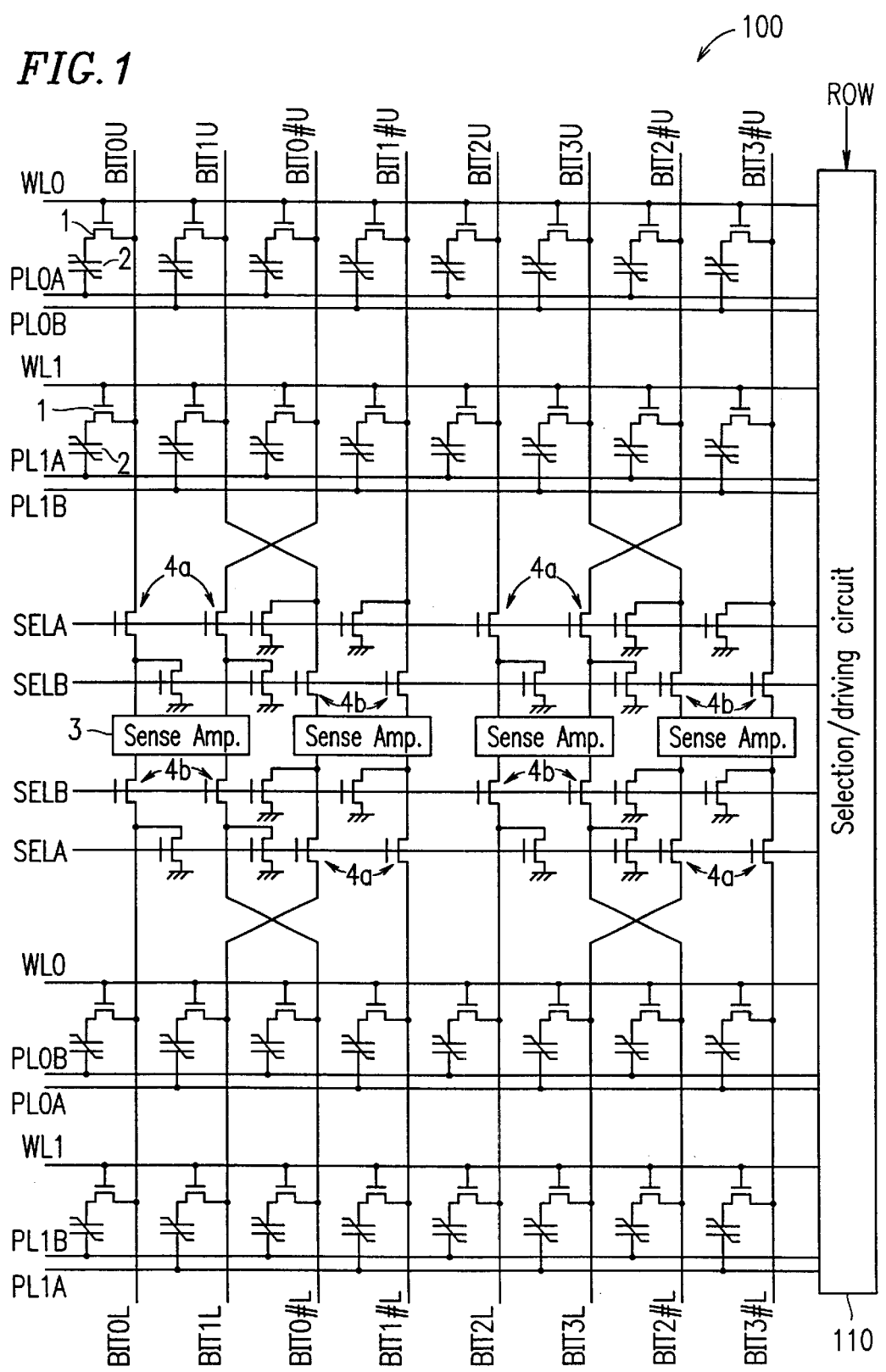
FIG. 1 is a block diagram illustrating the memory cell structure of a ferroelectric memory device according to Example 1 of the present invention.

FIG. 1 is a block diagram showing the memory cell structure of a ferroelectric memory device 100 according to Example 1 of the present invention. The ferroelectric memory device 100 is of a "2T2C" type, in which each memory cell is composed essentially of two semiconductor transistors 1 and two ferroelectric capacitors 2. One piece of data is stored in one memory cell.

A plurality of word lines (WL0(s), WL1(s)) and a plurality of bit lines (BIT0U, BIT1U, BIT0#U, BIT1#U, BIT2U, BIT3U, BIT2#U, BIT3#U, BIT0L, BIT1L, BIT0#L, BIT1#L, BIT2L, BIT3L, BIT2#L, BIT3#L,) intersect each other (illustrated as perpendicularly intersecting each other in FIG. 1). The word lines (WL0(s), WL1(s)) and plate lines (PL0A(s), PL0B(s), PL1A(s), PL1B(s)) are disposed substantially in parallel to each other. A source of each semiconductor transistor 1 is coupled to one of the bit lines; a drain of each semiconductor transistor 1 is coupled to a first electrode of the associated ferroelectric capacitor 2; a gate of each semiconductor transistor 1 is coupled to one of the word lines; and a second electrode of the associated ferroelectric capacitor 2 is coupled to one of the plate lines.

According to the present example, two plates lines are provided so as to correspond to one word line (so that the plate lines PL0A and PL0B correspond to each word line WL0; and the plate lines PL1A and PL1B correspond to each word line WL1). Different plate lines are coupled to memory cells which are coupled to adjoining bit lines. For example, the plate lines PL0A and PL1A are coupled to the memory cells which are coupled to the bit lines BIT0U, BIT0#U, BIT2U, BIT2#U, BIT1L, BIT1#L, BIT3L, and BIT3#L. Similarly, the plate lines PL0B and PL1B are coupled to the memory cells which are coupled to the bit lines BIT1U, BIT1#U, BIT3U, BIT3#U, BIT0L, BIT0#L, BIT2L, and BIT2#L. Moreover, four bit lines are coupled to the same sense amplifier 3 via respective transfer gates associated therewith. For example, the bit lines BIT0U and BIT0#U (via transfer gates 4a) and BIT0L and BIT0#L (via transfer gates 4b) are coupled to the same sense amplifier 3. The bit lines BIT1U and BIT1#U (via transfer gates 4b) and BIT1L and BIT1#L (via transfer gates 4a) are coupled to the same sense amplifier 3. The bit lines BIT2U and BIT2#U (via transfer gates 4a) and BIT2L and BIT2#L (via transfer gates 4b) are coupled to the same sense amplifier 3. The bit lines BIT3U and BIT3#U (via transfer gates 4b) and BIT3L and BIT3#L (via transfer gates 4a) are coupled to the same sense amplifier 3. Gates of the respective transfer gate transistors 4a which are coupled to the bit lines BIT0U, BIT0#U, BIT2U, BIT2#U, BIT1L, BIT1#L, BIT3L, and BIT3#L are coupled to a selection line SELA. Gates of the respective transfer gate transistors 4b which are coupled to the bit lines BIT1U, BIT1#U, BIT3U, BIT3#U, BIT0L, BIT0#L, BIT2L, and BIT2#L are coupled to a selection line SELB. In addition, a grounding transistor is coupled to each of the bit lines BIT0U, BIT0#U, BIT2U, BIT2#U, BIT1L, BIT1#L, BIT3L, and BIT3#L so as to conduct to the ground when the selection line SELB shifts to the "H" level. Similarly, a grounding transistor is coupled to each of the bit lines BIT1U, BIT1#U, BIT3U, BIT3#U, BIT0L, BIT0#L, BIT2L, and BIT2#L so as to conduct to the ground when the selection line SELA shifts to the "H" level.

The word lines (WL0(s), WL1(s)) and the plate lines (PL0A(s), PL0B(s), PL1A(s), PL1B(s)) are coupled to a selection/driving circuit 110. A ROW address is input to the selection/driving circuit 110.

Although not required in the present example, the selection lines SELA and SELB can be coupled to the selection/driving circuit 110 as shown in FIG. 1 because the selection lines SELA and SELB are to be selected in accordance with the particular word lines (WL0(s), WL1(s)) and the plate lines (PL0A(s), PL0B(s), PL1A(s), PL1B(s)) that are selected and activated.

Figure 9:
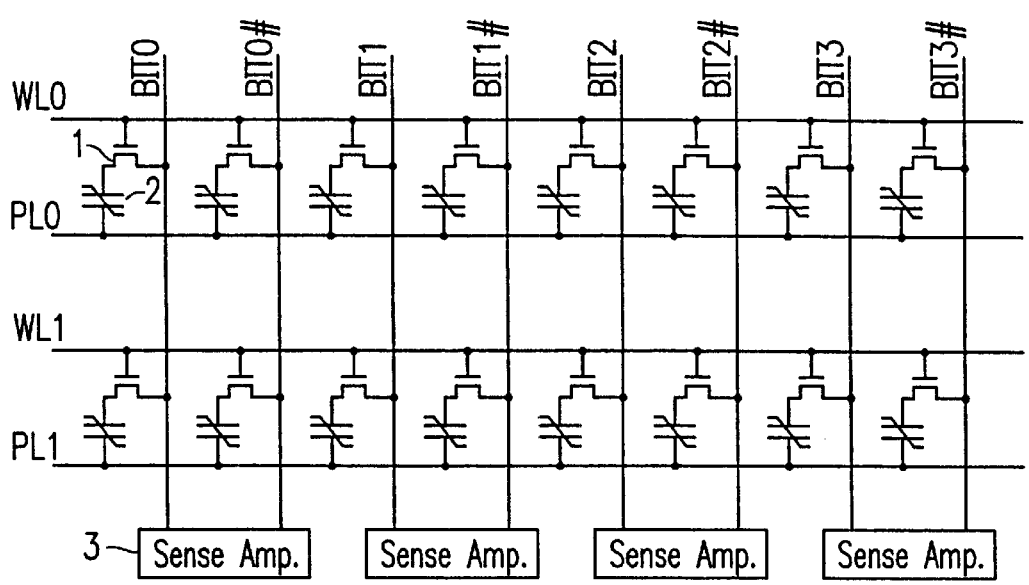
FIG. 9 is a block diagram illustrating the memory cell structure of a conventional ferroelectric memory device.
Figure 10:
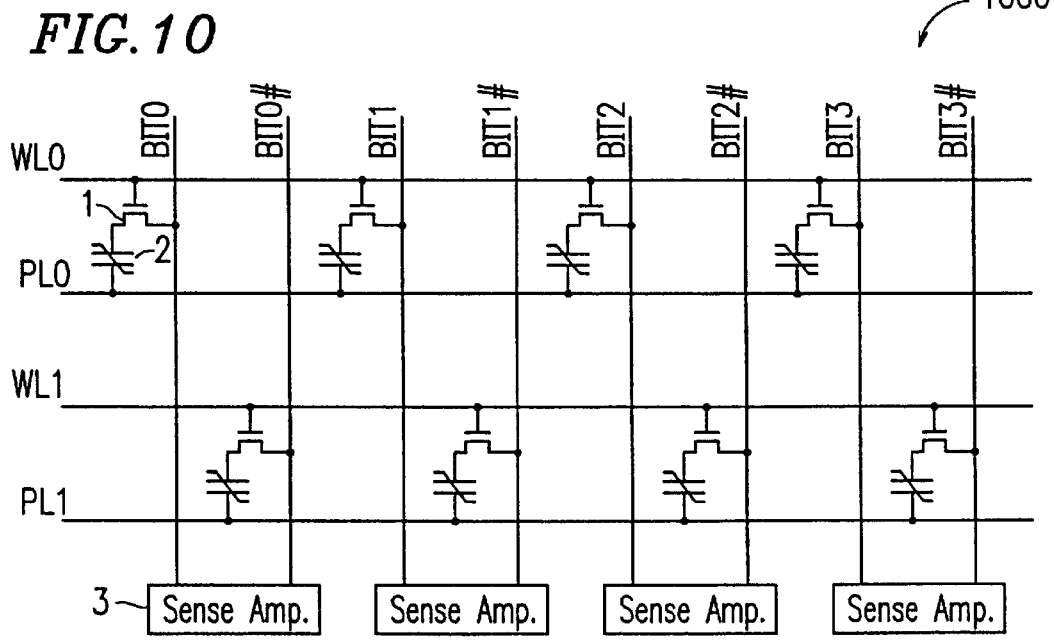
FIG. 10 is a block diagram illustrating the memory cell structure of another conventional ferroelectric memory device.

According to the present example of the invention, two word lines are activated by the selection/driving circuit 110 based on a portion of the input ROW address while ignoring the least significant bit of the ROW address, unlike in the aforementioned prior art techniques where one word line is selected based on an entire ROW address. The ignored least significant bit of the ROW address is used to select one of the two plate lines. For example, in the case where the two word lines WL0 are selected, either the plate lines PL0A or PL0B are selected. Thus, the capacitance of each plate line PL0A or PL0B is half of that in the conventional ferroelectric memory device 900 shown in FIG. 9, i.e., at the same level as that of the conventional "1T1C" type ferroelectric memory device 1000 shown in FIG. 10; and COL addresses are not used in the present example of the invention. As a result, according to the present example of the invention, the operational speed of the plate lines is improved because the capacitance of each plate line is reduced and because the operation occurs based on a ROW address, without using a COL address.

Hereinafter, signals which are applied to the various signal lines will be described in detail. Although the description below illustrates a case where the word lines WL0 and the plate lines PL0A are selected, the same principles would apply to the case where the word lines WL0 and the plate lines PL0B are selected, where the word lines WL1 and the plate lines PL1A are selected, or where the word lines WL1 and the plate lines PL1B are selected.

First, while driving the word lines WL0 to the "H" level, a pulse is applied to the plate lines PL0A, and the plate lines PL0 are fixed at the "L" level. The selection lines SELA for controlling the transfer gates 4a are driven to the "H" level so that the bit lines BIT0U, BIT0#U, BIT2U, BIT2#U, BIT1L, BIT#L, BIT3L, and BIT3#L are electrically coupled to the respective sense amplifiers 3. The selection lines SELB for controlling the transfer gates 4b are driven to the "L" level so that the bit lines BIT1U, BIT1#U, BIT3U, BIT3#U, BIT0L, BIT0#L, BIT2L, and BIT2#L are electrically isolated from the respective sense amplifiers 3. Data is output on the bit lines BIT0U, BIT0#U, BIT2U, BIT2#U, BIT1L, BIT1#L, BIT3L, and BIT3#L, which are coupled to the memory cells that are coupled to the word lines WL0 and the plate lines PL0A. The other bit lines BIT1U, BIT1#U, BIT3U, BIT3#U, BIT0L, BIT#L, BIT2L, and BIT2#L are grounded, and therefore fixed at the "L" level, since the signal on the selection line SELA is at the "H" level. In this state, the differential charge amounts from the respective memory cells are amplified by the sense amplifiers 3, resulting in "H" or "L" data being output on the corresponding bit lines.

According to the present example, since any activated bit line is adjoined by non-activated bit lines on both sides (which are fixed at the "L" level). As a result, the non-activated bit lines fixed at the "L" level function as shielding bit lines to reduce the mutual interference between bit lines during a sensing operation. Since the plate lines PL0B and the bit lines BIT1U, BIT1#U, BIT3U, BIT3#U, BIT0L, BIT0#L, BIT2L, and BIT2#L are at the "L" level in the above-illustrated case, the data stored in the ferroelectric capacitors 2 in the memory cells which are coupled to the shielding bit lines are not destroyed even when the semiconductor transistors 1 are turned on responsive to the word lines WL0 being driven to the "H" level.

EXAMPLE 2

Figure 2:
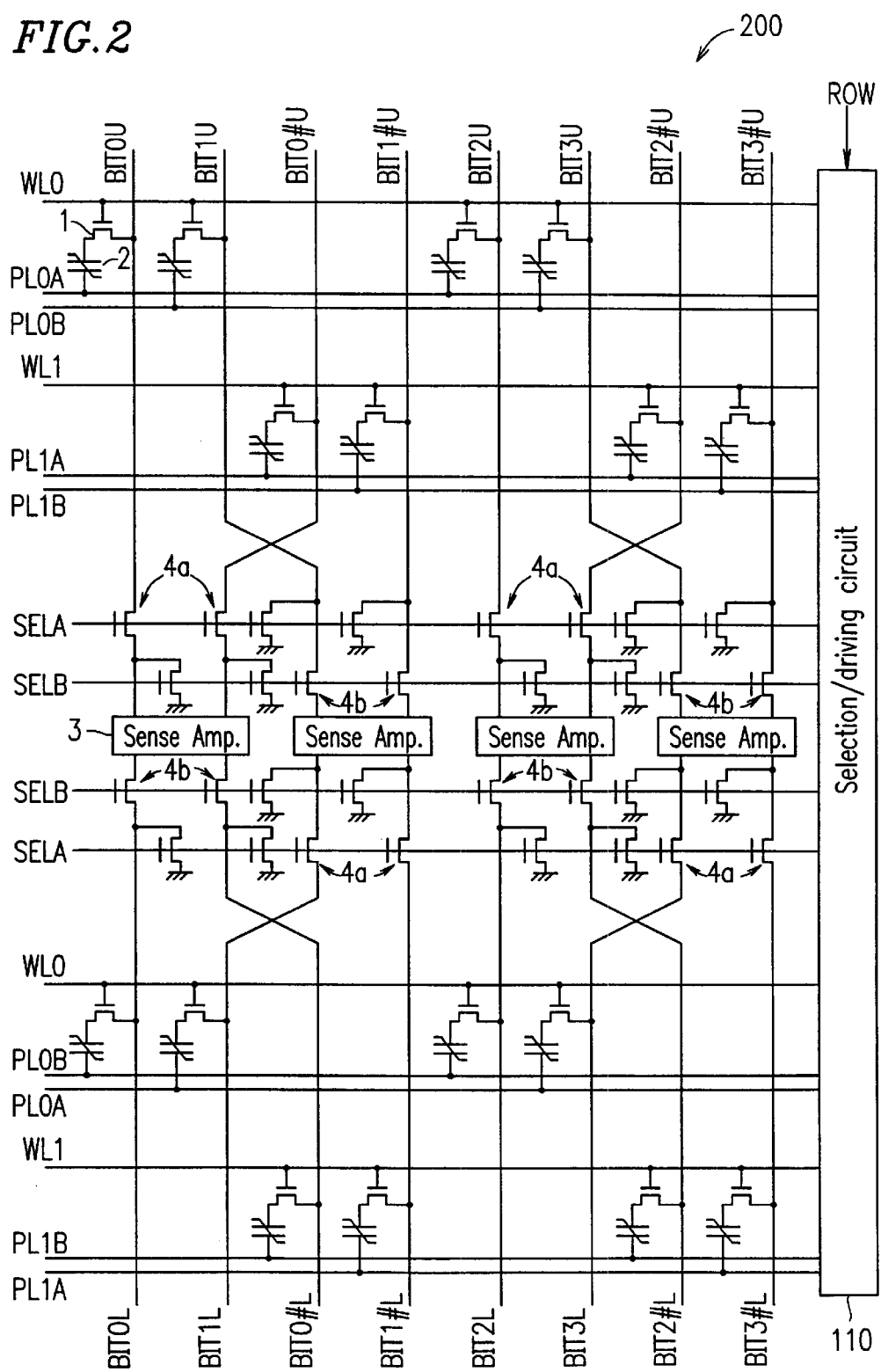
FIG. 2 is a block diagram illustrating the memory cell structure of a ferroelectric memory device according to Example 2 of the present invention.

FIG. 2 is a block diagram showing the memory cell structure of a ferroelectric memory device 200 according to Example 2 of the present invention. The ferroelectric memory device 200 is of a "1T1C" type, in which each memory cell is composed essentially of one semiconductor transistor 1 and one ferroelectric capacitor 2. One piece of data is stored in one memory cell. Similar effects are attained in this structure, as well as in the "2T2C" type ferroelectric memory device 100 according to Example 1.

The ferroelectric memory device 200 shown in FIG. 2 is similar to the ferroelectric memory device 100 shown in FIG. 1 in that memory cells are provided in the vicinity of the intersections of the word lined WL0 and bit lines BIT0U, BIT1U, BIT2U, BIT3U, BIT0L, BIT1L, BIT2L, and BIT3L. However, the ferroelectric memory device 200 shown in FIG. 2 is different from the ferroelectric memory device 100 shown in FIG. 1 in that no memory cells are provided in the vicinity of the intersections of the word lines WL0 and bit lines BIT0#U, BIT1#U, BIT2#U, BIT3#U, BIT0#L, BIT1#L, BIT2#L, and BIT3#L. Likewise, in the ferroelectric memory device 200 shown in FIG. 2, memory cells are provided in the vicinity of the intersections of the word lines WL1 and bit lines BIT0#U, BIT1#U, BIT2#U, BIT3#U, BIT0#L, BIT1#L, BIT2#L, and BIT3#L, whereas no memory cells are provided in the vicinity of the intersections of the word lines WL1 and bit lines BIT0U, BIT1U, BIT2U, BIT3U, BIT0L, BIT1L, BIT2L, and BIT3L. In the ferroelectric memory device 200 shown in FIG. 2, the word lines (WL0(s), WL1(s)) and the plate lines (PL0A(s), PL0B(s), PL1A(s), PL1B(s)) are coupled to a selection/driving circuit 110. A ROW address is input to the selection/driving circuit 110.

Figure 12:
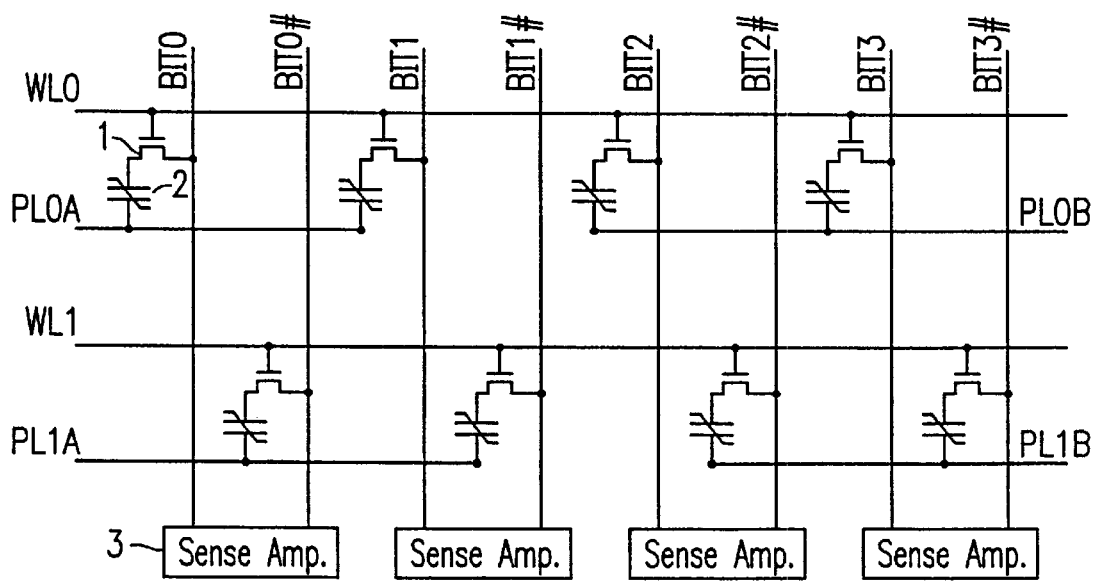
FIG. 12 is a block diagram illustrating the memory cell structure of yet another conventional ferroelectric memory device.

According to the present example of the invention, as in the case of the ferroelectric memory device 100 of Example 1, two word lines are activated by the selection/driving circuit 110 based on a portion of the input ROW address, while ignoring the least significant bit of the ROW address, and the ignored least significant bit of the ROW address is used to select one of the two plate lines. For example, in the case where the two word lines WL0 are selected, either the plate lines PL0A or PL0B are selected. The capacitance of each plate line PL0A or PL0B is half of that in the conventional ferroelectric memory device 1000 shown in FIG. 10, i.e., at the same level as that of the conventional ferroelectric memory device 1200 shown in FIG. 12; and COL addresses are not used in the present example of the invention. As a result, according to the present example of the invention, the operational speed of the plate lines is improved because the capacitance of each plate line is reduced and because the operation occurs based on a ROW address, without using a COL address.

Hereinafter, signals which are applied to the various signal lines will be described in detail. Although the description below illustrates a case where the word lines WL0 and the plate lines PL0A are selected, the same principles would apply to the case where the word lines WL0 and the plate lines PL0B are selected, where the word lines WL1 and the plate lines Pl1A are selected, or where the word lines WL1 and the plate lines PL1B are selected.

First, while driving the word lines WL0 to the "H" level, a pulse is applied to the plate lines PL0A, and the plate lines PL0B are fixed at the "L" level. The selection lines SELA for controlling the transfer gates 4a are driven to the "H" level so that the bit lines BIT0U, BIT0#U, BIT2U, BIT2#U, BIT1L, BIT1#L, BIT3L, and BIT3#L are electrically coupled to the respective sense amplifiers 3. The selection lines SELB for controlling the transfer gates 4b are driven to the "L" level so that the bit lines BIT1U, BIT1#U, BIT3U, BIT3#U, BIT0L, BIT0#L, BIT2L, and BIT2#L are electrically isolated from the respective sense amplifiers 3. DATA is output on the bit lines BIT0U, BIT2U, BIT1L, and BIT3L, which are coupled to the memory cells that are coupled to the word lines WL0 and the plate lines PL0A. A reference level is supplied to the bit lines BIT0#U, BIT2#U, BIT1#L, and BIT3#L from a reference cell (not shown) which is a level generation circuit for generating an intermediate level between the "H" and "L" levels. The other bit lines BIT1U, BIT1#U, BIT3U, BIT3#U, BIT0L, BIT0#L, BIT2L, and BIT2#L are grounded, and therefore fixed at the "L" level, since the signal on the selection line SELA is at the "H" level. In this state, the differential charge amounts from the respective memory cells are amplified by the sense amplifiers 3, resulting in "H" or "L" data being output on the corresponding bit lines.

According to the present example, any activated bit line is adjoined by non-activated bit lines on both sides (which are fixed at the "L" level). As a result, the non-activated bit lines fixed at the "L" level function as shielding bit lines to reduce the mutual interference between bit lines during a sensing operation. Since the plate lines PL0B and the bit lines BIT1U, BIT1#U, BIT3U, BIT3#U, BIT0L, BIT0#L, BIT2L, and BIT2#L are at the "L" level in the above-illustrated case, the data stored in the ferroelectric capacitors 2 in the memory cells which are coupled to the shielding bit lines are not destroyed even when the semiconductor transistors 1 are turned on responsive to the word lines WL0 being driven to the "H" level.

Examples 1 and 2 described above are each directed to a structure which utilizes both of the following techniques: 1)

a technique for reducing the capacitance of each plate line and allowing an operation to occur based on a ROW address (without using a COL address) so that an increased operational speed can be achieved; and 2) a shielding bit line technique for providing an improved sensing margin. However, these two inventive techniques can be utilized separately as illustrated in the following examples of the invention, because these techniques are not inseparable.

EXAMLE 3

The present example illustrates an embodiment where the inventive shielding bit line technique is utilized for providing an improved sensing margin. Although the present example illustrates a "2T2C" type ferroelectric memory device, the same principles would also apply to a "1T1C" type ferroelectric memory device.

Figure 3:
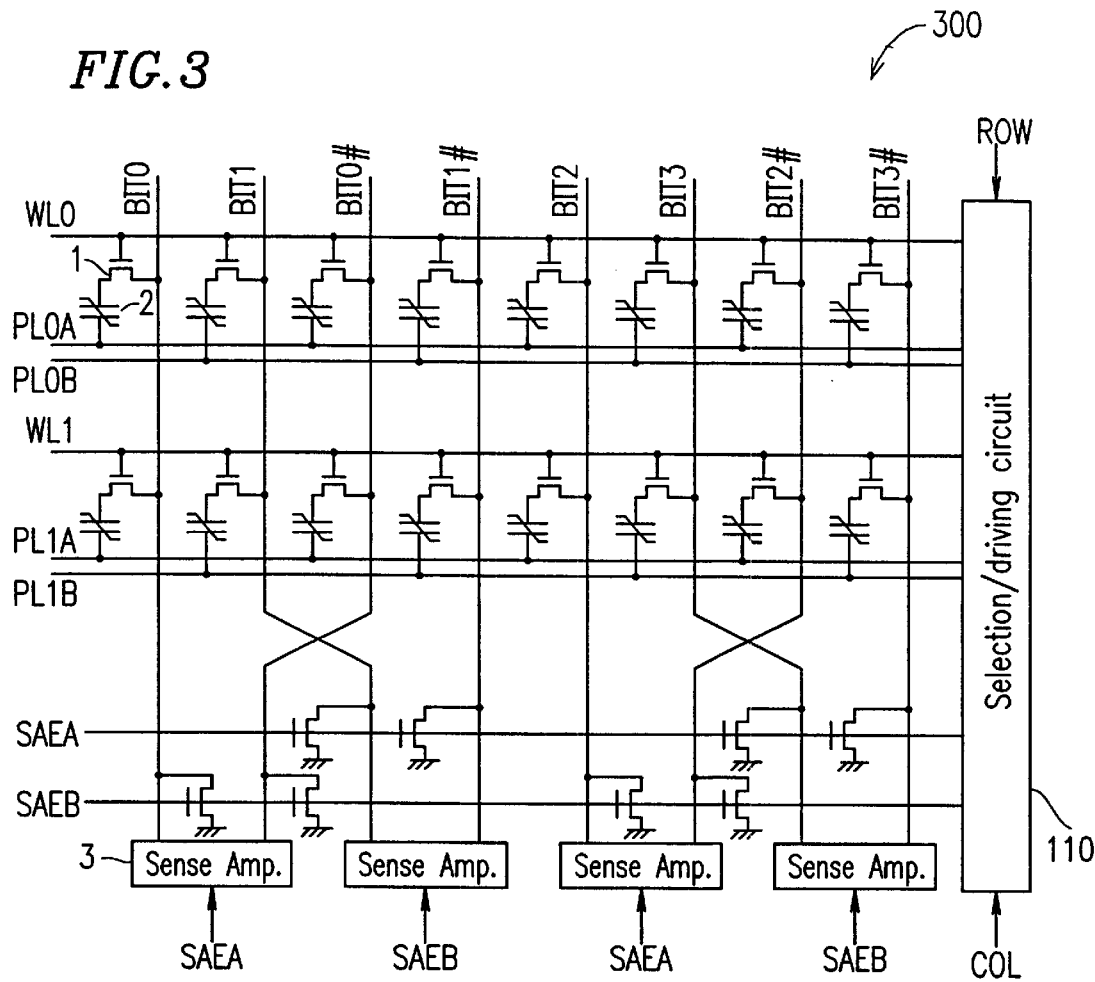
FIG. 3 is a block diagram illustrating the memory cell structure of a ferroelectric memory device according to Example 3 of the present invention.

FIG. 3 is a block diagram showing the memory cell structure of a ferroelectric memory device 300 according to Example 3 of the present invention. A plurality of word lines WL0, WL1 and a plurality of bit lines (BIT0, BIT1, BIT0#, BIT1#, BIT2, BIT3, BIT2#, BIT3#) intersect each other (illustrated as perpendicularly intersecting each other in FIG. 3). The word lines (WL0, WL1) and plate lines (Pl0A, PL0B, PL1A, PL1B) are disposed substantially in parallel to each other. A source of each semiconductor transistor 1 is coupled to one of the bit lines; a drain of each semiconductor transistor 1 is coupled to a first electrode of the associated ferroelectric capacitor 2; a gate of each semiconductor transistor 1 is coupled to one of the word lines; and a second electrode of the associated ferroelectric capacitor 2 is coupled to one of the plate lines.

According to the present example, two plate lines are provided so as to correspond to one word line (so that the plate lines Pl0A and Pl0B correspond to the word line WL0; and the plate lines PL1A and PL1B correspond to the word line WL1). Different plate lines are coupled to memory cells which are coupled to adjoining bit lines. For example, the plate lines PL0A and PL1A are coupled to the memory cells which are coupled to the bit lines BIT0, BIT0#, BIT2, and BIT2#. Similarly, the plate lines PL0B and PL1B are coupled to the memory cells which are coupled to the bit lines BIT1, BIT1#, BIT3, and BIT3#. Moreover, two bit lines are coupled to the same sense amplifier 3. For example, the bit lines BIT0 and BIT0# are coupled to the same sense amplifier 3; the bits lines BIT1 and BIT1# are coupled to the same sense amplifier 3; the bit lines BIT2 and BIT2# are coupled to the same sense amplifier 3; and the bit lines BIT3 and BIT3# are coupled to the same sense amplifier 3. In addition, a grounding transistor is coupled to each of the bit lines BIT0, BIT0#, BIT2, and BIT2# so as to conduct to the ground when a signal SAEB shifts to the "H" level. Similarly, a grounding transistor is coupled to each of the bit lines BIT1, BIT1#, BIT3, and BIT3# so as to conduct to the ground when a signal SAEA shifts to the "H" level.

Although not required in the present example, the selection lines SELA and SELB can be coupled to the selection/driving circuit 110 as shown in FIG. 3 because the selection lines SELA and SELB are to be selected in accordance with the particular word lines (WL0, WL1) and the plate lines (PL0A, PL0B, PL1A, PL1B) that are selected and activated.

In accordance with the ferroelectric memory device 300, the word lines (WL0, WL10 and the plate lines (PL0A, PL0B, PL1A, PL1B) are coupled to a selection/driving circuit 110. A ROW address and COL address are input to the selection/driving circuit 110.

According to the present example, the selection/driving circuit 110 selects the word lines based on a ROW address, and selects the plate lines based on a COL address.

Hereinafter, signals which are applied to the various signal lines will be described in detail. Although the description below illustrates a case where the word line WL0 and the plate line Pl0A are selected, the same principles would apply to the case where the word line WL0 and the plate line PL0B are selected, where the word line WL1 and the plate line PL1A are selected, or where the word line WL1 and the plate line PL1B are selected.

First, while driving the word line WL0 to the "H" level, a pulse is applied to the plate line PL0A, and the plate line PL0B is fixed to the "L" level. At this time, data is output on the bit lines BIT0, BIT0#, BIT2, and BIT2#, which are coupled to the memory cells that are coupled to the word line WL0 and the plate line PL0A. Then, the signal SAEA is driven to the "H" state so as to activate the sense amplifiers 3 which are coupled to the selected bit lines BIT0, BIT0#, BIT2, and BIT2#. At this time, the bit lines BIT1, BIT1#, BIT3, and BIT3# are grounded, and therefore fixed at he "L" level, since the signal SAEA is at the "H" level. The non-activated bit lines BIT1, BIT1#, BIT3, and BIT3# function as shielding bit lines to provide an improved sensing margin. Since the plate line PL0B and the bit lines BIT1, BIT1#, BIT3, and BIT3# are at the "L" level in the above-illustrated case, the data stored in the ferroelectric capacitors 2 in the memory cells which are coupled to the shielding bit lines are not destroyed even when the semiconductor transistors 1 are turned on responsive to the word lines WL0 being driven to the "H" level.

EXAMPLE 4

The present example illustrates an embodiment which utilizes the inventive technique of reducing the capacitance of each plate line and allowing an operation to occur without using a COL address, so that an increased operational speed can be achieved on the plate lines. Although the present example illustrates a "2T2C" type ferroelectric memory device, the same principles would also apply to a "1T1C" type ferroelectric memory device.

Figure 4:
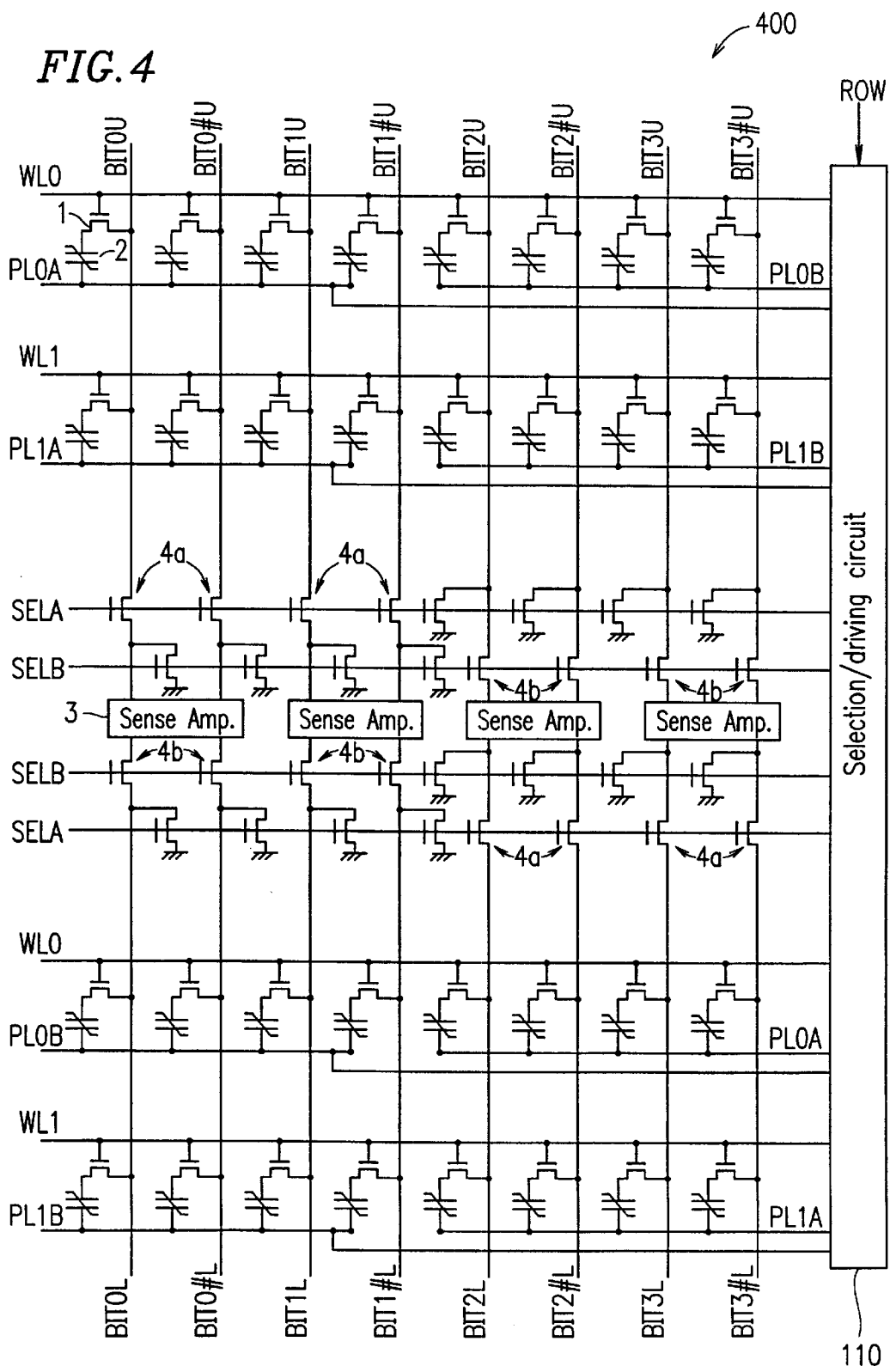
FIG. 4 is a block diagram illustrating the memory cell structure of a ferroelectric memory device according to Example 4 of the present invention.

FIG. 4 is a block diagram showing the memory cell structure of a ferroelectric memory device 400 according to Example 4 of the present invention. A plurality of word lines (WL0(s), Wl1(s)) and a plurality of bit lines (BIT0U, BIT0#U, BIT1U, BIT1#U, BIT2U, BIT2#U, BIT3U, BIT3#U, BIT0L, BIT0#L, BIT1L, BIT1#L, BIT2L, BIT2#L, BIT3L, BIT3#L,) intersect each other (illustrated as perpendicularly intersecting each other in FIG. 4). The word lines (WL0(s), WL1(s)) and plate lines (PL0A(s), PL0B(s), PL1A(s)) are disposed substantially in parallel to each other. A source of each semiconductor transistor 1 is coupled to one of the bit lines; a drain of each semiconductor transistor 1 is coupled to a first electrode of the associated ferroelectric capacitor 2; a gate of each semiconductor transistor 1 is coupled to one of the word lines; and a second electrode of the associated ferroelectric capacitor 2 is coupled to one of the plate lines. The word lines (WL0(s), WL1(s)) and the plate lines (Pl0A(s), PL0B(s), PL1A(s), Pl1B(s)) are coupled to a selection/driving circuit 110. A ROW address is input to the selection/driving circuit 110.

According to the present example, two plate lines are provided so as to correspond to one word line (so that the plate lines PL0A or PL0B correspond to each word line WL0; and the plate lines Pl1A or Pl1B correspond to each word line WL1). The plate lines Pl0A an PL1A are coupled to the memory cells which are coupled to the bit lines BIT0U, BIT0#U, BIT1U, BIT1#U, BIT2L, BIT2#L, BIT3L, and BIT3#L. Similarly, the plate lines PL0B and PL1B are coupled to the memory cells which are coupled to the bit lines BIT2U, BIT2#U, BIT3U, BIT3#U, BIT0L, BIT1#L, BIT1L and BIT1#L. Moreover, four bit lines are coupled to the same sense amplifier 3 via respective transfer gates associated therewith. For example, the bit lines BIT0U and BIT0#U (via transfer gates 4a) and BIT0L and BIT0#L (via transfer gates 4b) are coupled to the same sense amplifier 3. The bit lines BIT1U and BIT1#U (via transfer gates 4a) and BIT1L and BIT1#L (via transfer gates 4b) are coupled to the same sense amplifier 3. The bit lines BIT2U and BIT2#U (via transfer gates 4b) and BIT2L and BIT2#L (via transfer gates 4a) are coupled to the same sense amplifier 3. The bit lines BIT3U and BIT3#U (via transfer gates 4b) and BIT3L and BIT3#L (via transfer gates 4a) are coupled to the same sense amplifier 3.

Figure 11:
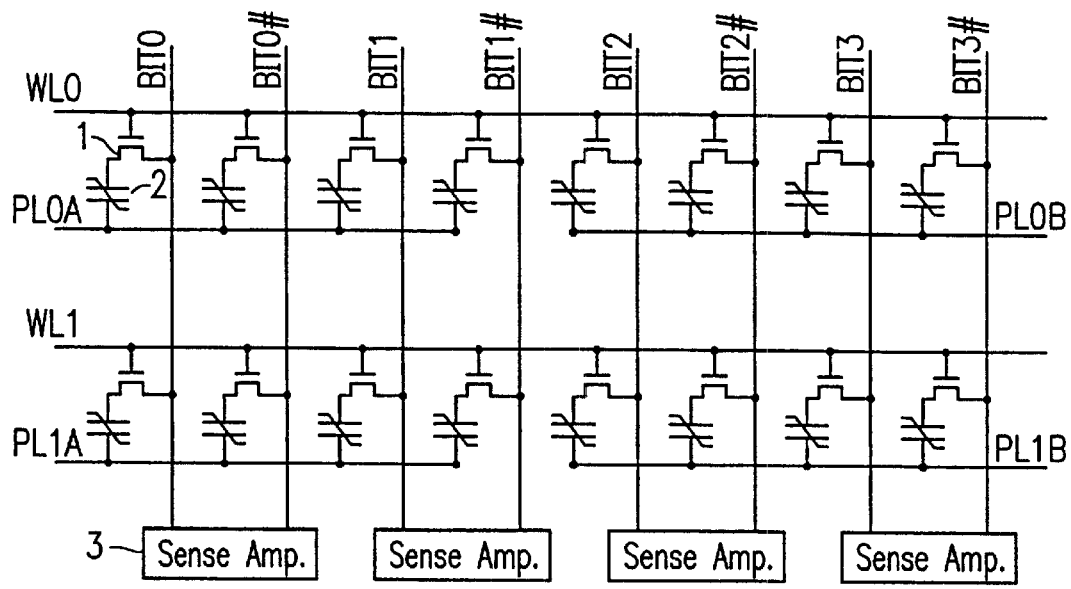
FIG. 11 is a block diagram illustrating the memory cell structure of yet another conventional ferroelectric memory device.

According to the present example of the invention, two word lines are activated by the selection/driving circuit 110 based on a portion of the input ROW address, while ignoring the least significant bit of the ROW address. The ignored least insignificant bit of the ROW address is used to select one of the two plate lines. For example, in the case where the two word lines WL0 are selected, either the plate lines PL0A or PL0B are selected. Thus, the capacitance of each plate line PL0A or PL0B is half of that in the conventional ferroelectric memory device 900 shown in FIG. 9, i.e., at the same level as that of the conventional ferroelectric memory device 1100 shown in FIG. 11; and COL addresses are not used in the present example of the invention. As a result, according to the present example of the invention, the operational speed of the plate lines is improved because the capacitance of each plate line is reduced and because the operation occurs based on a ROW address, without using a COL address.

EXAMPLE 5

The present example illustrates another embodiment which utilizes the inventive technique of reducing the capacitance of each plate line and allowing an operation to occur without using a COL address, so that an increased operational speed can be achieved on the plate lines. Although the present example illustrates a "2T2C" type ferroelectric memory device, the same principles would also apply to a "1T1C" type ferroelectric memory device.

Figure 5:
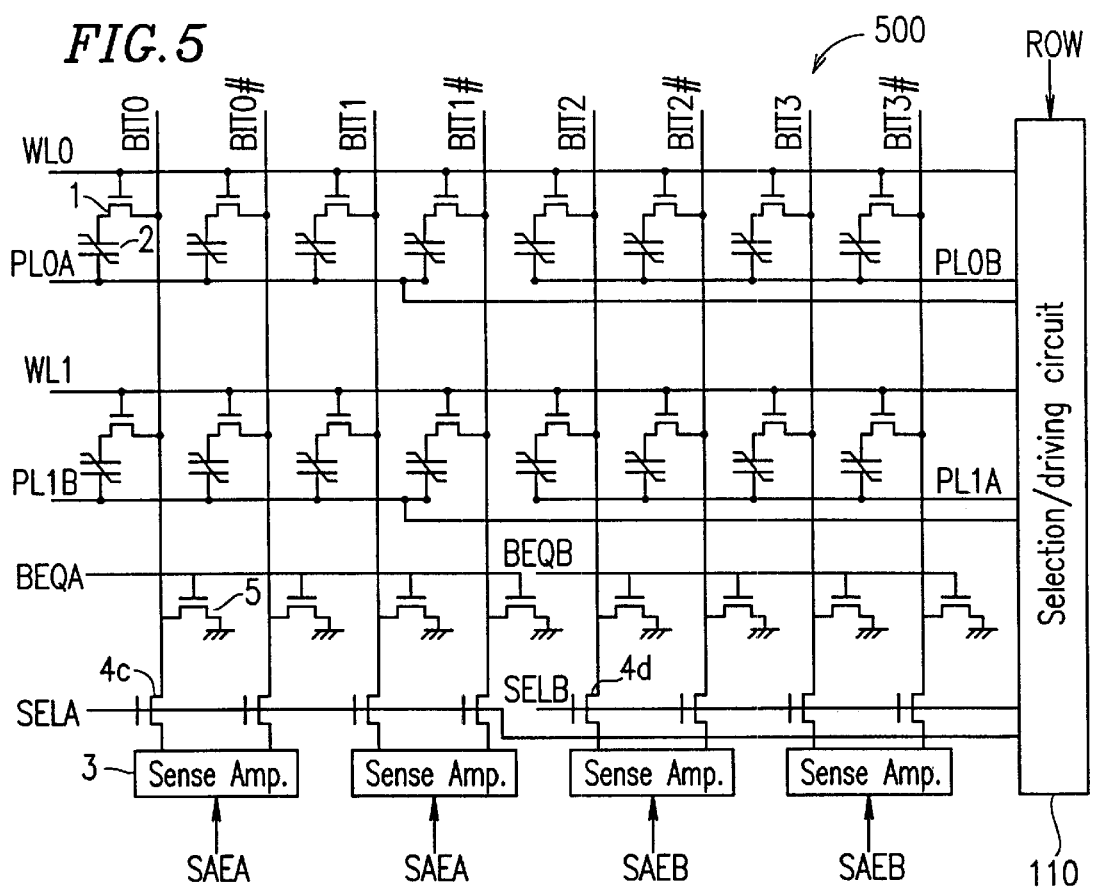
FIG. 5 is a block diagram illustrating the memory cell structure of a ferroelectric memory device according to Example 5 of the present invention.

FIG. 5 is a block diagram showing the memory cell structure of a ferroelectric memory device 500 according to Example 5 of the present invention. A plurality of word lines (WL0, WL1) and a plurality of bit lines (BIT0, BIT0#, BIT1, BIT1#, BIT2, BIT2#, BIT3, BIT3#) intersect each other (illustrated as perpendicularly intersecting each other in FIG. 5). The word lines (Wl0, WL1) and plate lines (PL0A, PL0B, PL1A, PL1B) are disposed substantially in parallel to each other. A source of each semiconductor transistor 1 is coupled to one of the bit lines; a drain of each semiconductor transistor 1 is coupled to a first electrode of the associated ferroelectric capacitor 2; a gate of each semiconductor transistor 1 is coupled to one of the word lines; and a second electrode of the associated ferroelectric capacitor 2 is coupled to one of the plate lines. The word lines (WL0, WL1) and the plate lines (PL0A, PL0B, PL1A, PL1B) are coupled to a selection/driving circuit 110. A ROW address is input to the selection/driving circuit 110.

In accordance with the ferroelectric memory device 500, bit-line equalization lines BEQA and BEQB are provided so as to intersect the bit lines. Gates of transistors 5 are coupled to the bit-line equalization line BEQA or BEQB. The sources of the transistors 5 are coupled to the respective bit lines. The drains of the transistors 5 are grounded. Specifically, the gates of the transistors 5 whose sources are coupled to the BIT, BIT0#, BIT1, and BIT1# are coupled to the bit-line equalization line BEQA. The gates of the transistors 5 whose sources are coupled to the BIT2, BIT2#, BIT3, and BIT3# are coupled to the bit-line equalization line BEQB.

According to the present example, two plate lines are provided so as to correspond to one word line (so that the plate lines PL0A and PL0B correspond to the word line WL0; and the plate lines PL1A or PL1B correspond to the word line WL1). The plate lines PL0A and PL1B are coupled to the memory cells which are coupled to the bit lines BIT0, BIT0#, BIT1, and BIT1#. Similarly, the plate lines PL0B and PL1A are coupled to the memory cells which are coupled to the bit lines BIT2, BIT2#, BIT3, and BIT3#. Moreover, two bit lines are coupled to the same sense amplifier 3 via respective transfer gates associated therewith. For example, the bit lines BIT0 and BIT0# are coupled to the same sense amplifier 3 via transfer gates 4c. The bit lines BIT1 and BIT1# are coupled to the same sense amplifier 3 via transfer gates 4c. The bits lines BIT2 and BIT2# are coupled to the same sense amplifier 3 via transfer gates 4d. The bit lines BIT3 and BIT3# are coupled to the same sense amplifier 3 via transfer gates 4d. Gates of the transfer gate transistors 4c and 4d are coupled to selection lines SELA and SELB, respectively.

Although the ferroelectric memory device 400 according to Example 4 employs a shared sense amplifier method, the ferroelectric memory device 500 according to the present example reads data from the memory cells without using a shared sense amplifier method. Although the description below illustrates a case where the plate lines PL0A and PL1A are selected, the same principles would apply to the case where the plate lines PL0B and PL1B are selected.

Figure 6:
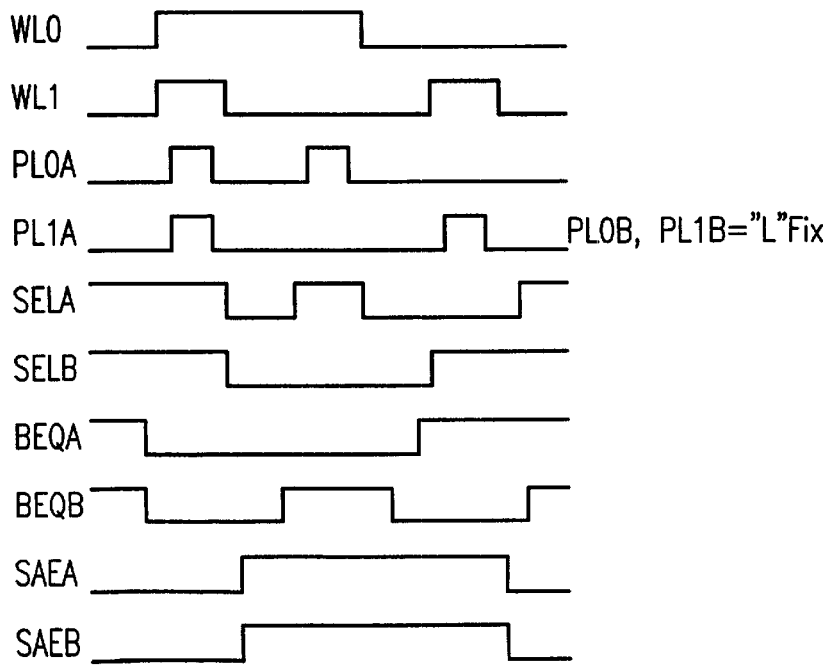
FIG. 6 is a timing diagram illustrating various signals according to Example 5 of the present invention.

First, as shown in FIG. 6, bit line equalization signals BEQA and BEQB are driven to the "L" level. Next, two word lines WL0 and WL1 are activated by the selection/driving circuit 110 based on a portion of the input ROW address, while ignoring the least significant bit of the ROW address. The ignored least significant bit of the ROW address is used to select the two plate lines PL0A and PL1A, and a pulse is applied to the plate lines so that the respective charge amounts are read on the bit lines BIT0, BIT0#, BIT1, BIT1#, BIT2, BIT2#, BIT3, and BIT3#. At this time, the plate lines PL0B and PL1B are fixed at the "L" level. Although the read charge amounts are carried onto the plate lines PL0B and PL1B via the bit lines because the word lines WL0 and WL1 are at the "H" level, the data stored in the ferroelectric capacitors 2 are not destroyed since these charge amounts are relatively small. Next, the selection lines SELA and SELB for controlling the transfer gates 4c and 4d, respectively, are driven to the "L" level so as to electrically isolate the bit lines from the sense amplifiers 3. Thereafter, the control lines SAEA and SAEB are driven to the "H" level so as to activate the sense amplifiers 3. After completing the sensing, data are read onto data lines (not shown) from the bit lines, and the data are rewritten to the memory cells.

During rewriting, it must be ensured that the data stored in the memory cells coupled to the plate lines PL0B and PL1B are not destroyed. Therefore, data are rewritten at different times for the two word lines WL0 and WL1. First, the word line WL1 is driven to the "L" level so that all of the memory cells which are coupled to the word line WL1 are electrically isolated from bit lines. The bit line equalization signal BEQB is driven to the "H" level so that the bit lines BIT2, BIT2#, BIT3, and BIT3# are equalized to the "L" level. Next, the selection line SELA for controlling the transfer gates 4c is driven to the "H" level, and data are transferred from the sense amplifiers 3 to the bit lines BIT0, BIT0#, BIT1, and BIT1#. A pulse is applied to the plate line PL0A so as to perform rewriting of the data. Since the bit lines BIT2, BIT2#, BIT3, and BIT3# and the plate line PL0B are at the "L" level at this time, the data stored in the memory cells which are coupled to the plate line PL0B are not destroyed. Then, the word line WL0 is driven to the "L" level so that all of the memory cells which are coupled to the word line WL0 are electrically isolated from bit lines. The bit line equalization signal BEQA is driven to the "H" level so that the bit lines BIT0, BIT0#, BIT1, and BIT1# are equalized to the "L" level. Next, the selection line SELB for controlling the transfer gates 4d is driven to the "H" level, and data are transferred from the sense amplifiers 3 to the bit lines BIT2, BIT2#, BIT3, and BIT3#. A pulse is applied to the plate line PL1A so as to perform rewriting of the data. Since the bit lines BIT0, BIT0#, BIT1, and BIT1# and the plate line PL1B are at the "L" level at this time, the data stored in the memory cells which are coupled to the plate line PL1B are not destroyed.

As a result, according to the present example of the invention, the operational speed of the plate lines is improved because the capacitance of each plate line is reduced and because the operation occurs based on a ROW address, without using a COL address.

Although Examples 1 to 5 illustrate embodiments in which two plate lines are provided so as to correspond to one word line, more plate lines may be provided so as to correspond to one word line. By ignoring one bit (e.g., the least significant bit) of the ROW address during the selection of word lines, the ignored (least significant) bit of the ROW address can be used to select at least one of the two plate lines provided corresponding to one word line. By ignoring two bits of the ROW address during the selection of word lines, the ignored bits of the ROW address can be used to select at least one of four plate lines provided corresponding to one word line. Thus, $2^n$ plate lines can be provided so as to correspond to one word line. It is preferable to provide two plate lines so as to correspond to one word line.

Figure 7:
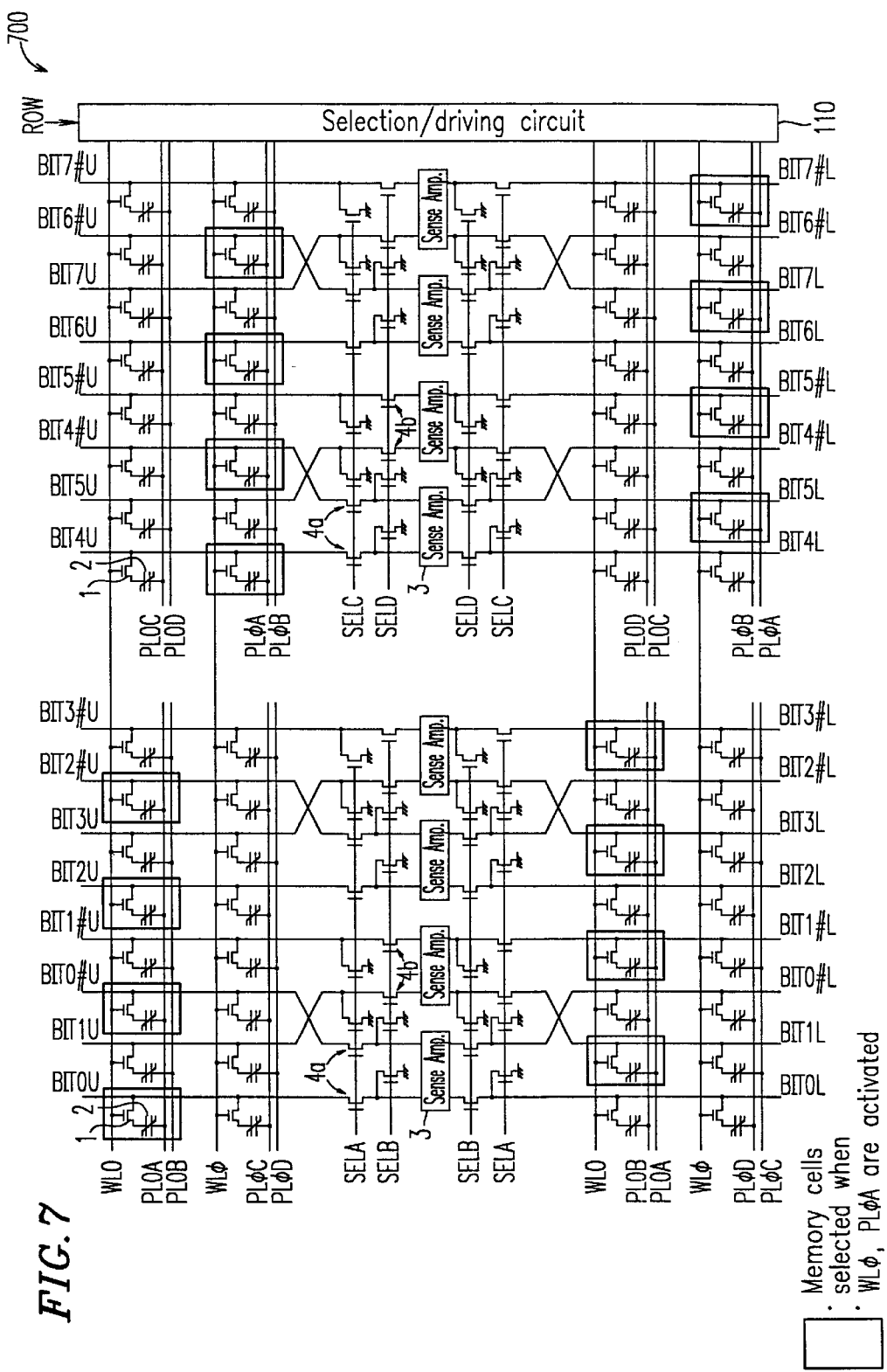
FIG. 7 is a block diagram illustrating the memory cell structure of a ferroelectric memory device according to an example of the present invention.

For example, in a ferroelectric memory device 700 shown in FIG. 7, where four plate lines are provided so as to correspond to one word line, a word line WL$\phi$ is selected and activated based on a portion of an input ROW address while ignoring two bits of the ROW address. The ignored two bits of the ROW address are used to select a plate line PL$\phi$A, which is activated to select the associated memory cell. A shielding bit effect is also provided in this case. In order to ensure that the stored data are not destroyed during sensing, it is necessary to perform a read operation following the procedure described in Example 5.

Figure 8:
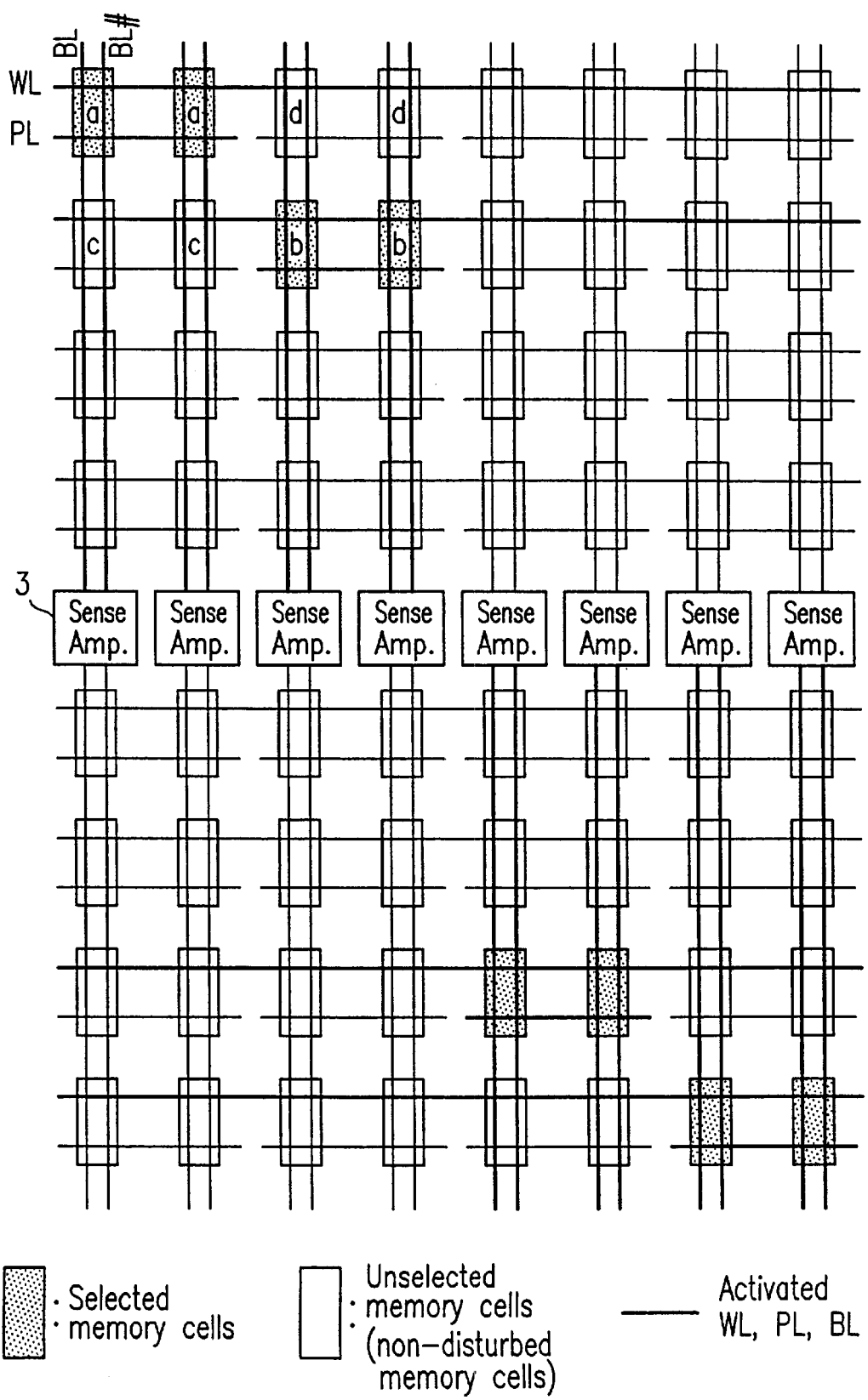
FIG. 8 is a block diagram illustrating the memory cell structure of a ferroelectric memory device according to an example of the present invention.

Alternatively, in accordance with a ferroelectric memory device 800 shown in FIG. 8, memory cells can be selected by activating selected ones (shown by thick lines) of the word lines WL, plate lines PL, and bit lines BL. In this case, too, it is necessary to perform a read operation following the procedure described in Example 5 in order to ensure that the stored data are not destroyed during sensing. For example, when memory cells a are sensed, the word line WL which is coupled to memory cells c is turned off so that the data stored in the memory cells c are not destroyed. When memory cells b are sensed, the word line WL which is coupled to memory cells d is turned off so that the data stored in the memory cells d are not destroyed.

As described in detail above, according to the present invention, it is possible to divide plate lines based only on a ROW address, without having to wait for a COL address to be input. As a result, the operational speed of the plate lines is improved because the capacitance of each plate line is reduced. Moreover, an improved sensing margin can be provided by utilizing the inventive shielding bit line technique. The present invention is applicable to a ferroelectric memory device of either a "2T2C" or "1T1C" type.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A ferroelectric memory device comprising:

a matrix of memory cells each including a semiconductor transistor and a ferroelectric capacitor;

a plurality of word lines and a plurality of bit lines provided so as to intersect each other; and a plurality of plate lines provided substantially in parallel to the word lines, at least two plate lines corresponding to each of the word lines, wherein a drain of the semiconductor transistor is coupled to a first electrode of the ferroelectric capacitor; a source of the semiconductor transistor is coupled to a corresponding one of the plurality of bit lines; a gate of the semiconductor transistor is coupled to a corresponding one of the plurality of word lines; and a second electrode of the ferroelectric capacitor is coupled to a corresponding one of the plurality of plate lines, the ferroelectric memory device further comprising:

a selection/driving circuit being coupled to the plurality of word lines and the plurality of plate lines and receiving a ROW address, the ROW address being divided into a first portion and a second portion, wherein the first portion of the ROW address is used to select and activate at least one of the plurality of word lines, the at least one word line defining a broader area than is designated by the ROW address, and wherein the second portion of the ROW address is used to select and activate at least one of the plurality of plate lines, thereby selecting at least one of the plurality of memory cells whose corresponding word line and whose corresponding plate line are both activated.

2. A ferroelectric memory device according to claim 1, wherein two or more plate lines are provided so as to correspond to each of the plurality of word lines, and wherein memory cells coupled to adjoining ones of the plurality of bit lines are coupled to different ones of the plurality of plate lines.

3. A ferroelectric memory device according to claim 1, further comprising a transfer gate for electrically coupling a selected one of the plurality of bit lines to a sense amplifier and a grounding transistor for electrically isolating an unselected one of the plurality of bit lines from a sense amplifier, wherein a signal for controlling the transfer gate fixes the unselected one of the plurality of bit lines at a level which will not destroy data stored in the unselected memory cells.

4. A ferroelectric memory device according to claim 1, further comprising sense amplifiers coupled to the plurality of bit lines, wherein a signal for activating at least one of the sense amplifiers that is coupled to the selected one of the plurality of bit lines fixes the unselected one of the plurality of bit lines at a level which will not destroy data stored in the unselected memory cells.

5. A ferroelectric memory device according to claim 1, wherein the selection/driving circuit selects two or more of the plurality of memory cells coupled to the same one of the plurality of bit lines by selecting and activating two or more of the plurality of word lines, and wherein the selection/driving circuit further selects at least one memory cell from among the two or more selected memory cells coupled to the same bit line by selecting and activating at least one of the plurality of plate lines.

6. A ferroelectric memory device comprising:

a matrix of memory cells each including a semiconductor transistor and a ferroelectric capacitor;

a plurality of word lines and a plurality of bit lines provided so as to intersect each other; and a plurality of plate lines provided substantially in parallel to the word lines, at least two plate lines corresponding to each of the word lines, wherein a drain of the semiconductor transistor is coupled to a first electrode of the ferroelectric capacitor; a source of the semiconductor transistor is coupled to a corresponding one of the plurality of bit lines; a gate of the semiconductor transistor is coupled to a corresponding one of the plurality of word lines; and a second electrode of the ferroelectric capacitor is coupled to a corresponding one of the plurality of plate lines, and wherein memory cells coupled to adjoining ones of the plurality of bit lines are coupled to different ones of the plurality of plate lines.

7. A ferroelectric memory device according to claim 6, further comprising a transfer gate for electrically coupling a selected one of the plurality of bit lines to a sense amplifier and a grounding transistor for electrically isolating an unselected one of the plurality of bit lines from a sense amplifier, wherein a signal for controlling the transfer gate fixes the unselected one of the plurality of bit lines at a level which will not destroy data stored in the unselected memory cells.

8. A ferroelectric memory device according to claim 6, further comprising sense amplifiers coupled to the plurality of bit lines, wherein a signal for activating at least one of the sense amplifiers that is coupled to the selected one of the plurality of bit lines fixes the unselected one of the plurality of bit lines at a level which will not destroy data stored in the unselected memory cells.

9. A ferroelectric memory device according to claim 6, wherein the selection/driving circuit selects two or more of the plurality of memory cells coupled to the same one of the plurality of bit lines by selecting and activating two or more of the plurality of word lines, and wherein the selection/driving circuit further selects at least one memory cell from among the two or more selected memory cells coupled to the same bit line by selecting and activating at least one of the plurality of plate lines.

* * * * *